United States Patent
Lin et al.

(10) Patent No.: US 6,180,419 B1
(45) Date of Patent: *Jan. 30, 2001

(54) METHOD OF MANUFACTURING MAGNETIC FIELD TRANSDUCER WITH IMPROVED SENSITIVITY BY PLATING A MAGNETIC FILM ON THE BACK OF THE SUBSTRATE

(75) Inventors: Hsiao-Yi Lin; Tan-Fu Lei; Ci-Lin Pan; Chun Y. Chang; Jz-Jan Jeng, all of Hsin-Chu (TW)

(73) Assignee: National Science Council, Taipei (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/715,934

(22) Filed: Sep. 19, 1996

(51) Int. Cl.⁷ .................................................... H01L 21/00
(52) U.S. Cl. ..................................................... 438/3
(58) Field of Search .................... 438/49, 48, 3; 257/108, 252, 422, 421, 427

(56) References Cited

U.S. PATENT DOCUMENTS

| | | | |
|---|---|---|---|
| 3,800,193 | * | 3/1974 | Ashar et al. ............... 317/235 R |
| 4,607,271 | * | 8/1986 | Popovic et al. . | |
| 4,667,391 | * | 5/1987 | Chapuy et al. . | |
| 4,772,929 | * | 9/1988 | Manchester ............... 357/27 |
| 5,070,317 | * | 12/1991 | Bhagat . | |
| 5,198,795 | * | 3/1993 | Shibasaki et al. ............ 328/32 |
| 5,652,445 | * | 7/1997 | Johnson . | |

FOREIGN PATENT DOCUMENTS 62-086880 * 4/1987 (JP) .

* cited by examiner

Primary Examiner—Charles Bowers
Assistant Examiner—Evan Pert
(74) Attorney, Agent, or Firm—Knobbe, Martens, Olson & Bear, LLP

(57) ABSTRACT

A method for manufacturing a magnetic field transducing device is provided which includes (a) providing a substrate, (b) subjecting the substrate to a semiconductor device fabricating process in order to obtain a magnetic field transducer, (c) forming an oxide over the magnetic field transducer and (d) covering a magnetic film on the oxide in order to obtain the magnetic field transducing device. The semiconductor device fabricating process also includes (b1) utilizing a mask photolithography etching process to form an annular groove on the substrate, (b2) covering a first insulating layer on the substrate and using a second mask photolithography etching process to form a plurality of diffusing openings on the first insulation layer, (b3) forming extrinsic semiconductor region on the substrate exposed by the plurality of diffusing openings, (b4) forming a second insulation layer on the substrate, (b5) utilizing a third mask photolithography etching process to form a plurality of contacts on the extrinsic semiconductor region, and (b6) forming a conductor on the substrate in order to form a connecting line. The magnetic film is preferably made of Ni and Co.

15 Claims, 8 Drawing Sheets

NOT TO SCALE

NOT TO SCALE

NOT TO SCALE

NOT TO SCALE

METHOD OF MANUFACTURING MAGNETIC FIELD TRANSDUCER WITH IMPROVED SENSITIVITY BY PLATING A MAGNETIC FILM ON THE BACK OF THE SUBSTRATE

BACKGROUND OF THE INVENTION

The present invention relates to a method for manufacturing a semiconductor device, and more especially to a method for manufacturing a magnetic field transducer.

FIELD OF THE INVENTION

A Hall Effect device is frequently employed as a transducer in a circuit for sensing a magnetic field. However, the circuit layout is desired in an integrated circuit form at the present time, so the ability to incorporate the transducer as part of the integrated circuit is therefore considered in the present invention.

Although silicon is frequently used to manufacture the semiconductor device, the carrier mobility of silicon is relatively lower than that of the III V group such as GaAs and InP so that its sensitivity is reduced. It is quite bothersome to ask for a relatively higher gain upon designing the process of the integrated circuit layout, since a demand for higher gain leads to unavoidable trouble in achieving the after-stage amplifying circuit layout. Therefore, if the sensitivity of the transducer can be improved, it is very helpful to integrate the transducer with the integrated circuit.

SUMMARY OF THE INVENTION

The object of the present invention is to manufacture a Hall magnetic field transducing device having a high sensitivity, and capable of being integrated well within an integrated circuit by utilizing a silicon material which is frequently employed for fabricating the integrated circuit.

According to the present invention, a method for manufacturing a magnetic field transducing device includes (a) providing a substrate, (b) subjecting the substrate to a semiconductor device fabricating process in order to obtain a magnetic field transducer, (c) forming an oxide over the magnetic field transducer and (d) covering a magnetic film on the oxide in order to obtain the magnetic field transducing device.

In accordance with an aspect of the present invention, the substrate is an n-type silicon substrate.

In accordance with another aspect of the present invention, the semiconductor device fabricating process includes following steps (b1) utilizing a first mask photolithography etching process to form an annular groove on the substrate, (b2) covering a first insulation layer on the substrate and using a second mask photolithography etching process to form a plurality of diffusing openings on the first insulation layer, (b3) forming a an extrinsic semiconductor on the substrate exposed by the plurality of diffusing openings, (b4) forming a second insulation layer on the substrate, (b5) utilizing a third mask photolithography etching process to form a plurality of contacts on the extrinsic semiconductor and (b6) forming a conductor on the substrate in order to form a contacting line.

In accordance with another aspect of the present invention, the first mask photolithography etching process further includes following steps (b11) forming a first photoresist on the substrate and utilizing the first photolithography process to form an exposed annular portion on the substrate and (b12) etching the exposed substrate by a first etching solution in order to define the annular groove.

In accordance with another aspect of the present invention, the first etching solution includes $HNO_3$, $HF(Aq)$ and $CH_3COOH$ with a ratio of 26:1:33.

In accordance with another aspect of the present invention, a depth, a width and a circumference of the annular groove are respectively about 2 $\mu$m, 100 $\mu$m and 400 $\mu$m.

In accordance with another aspect of the present invention, the second mask photolithography etching process further includes following steps (b21) forming a second photoresist on the substrate and using the second photolithography process to form a first plurality of exposed regions on the substrate and (b22) etching the first plurality of exposed regions by a second etching solution to form the plurality of diffusing openings.

In accordance with another aspect of the present invention, the second etching solution includes $HNO_3$, $HF(Aq)$ and $CH_3COOH$ with a ratio of 26:1:33.

In accordance with another aspect of the present invention, the step (b3) further includes following steps (b31) heating the substrate by a heater at about 900° C., and predepositing the substrate by $POCl_3$ at about 25° C. for about 10 minutes and (b32) processing a drive-in process at about 900° C. for about 20 minute in order to diffuse an n+ region in the substrate.

In accordance with another aspect of the present invention, the third mask photolithography etching process further includes following steps (b41) forming a third photoresist on the substrate and using the third photolithography process to form a second plurality of exposed regions on the substrate and (b42) etching the second plurality of exposed regions by a third etching solution to form the plurality of contacts.

In accordance with another aspect of the present invention, the third etching solution includes $HNO_3$, $HF(Aq)$ and $CH_3COOH$ with a ratio of 26:1:33.

In accordance with another aspect of the present invention, the connecting line is formed by plating an aluminum (Al) having a thickness of about 500 nm over the substrate and processing the aluminum by a fourth mask photolithography etching process which further includes a step of patterning the plated aluminum patterned into the connecting line.

In accordance with another aspect of the present invention, the oxide is formed by depositing a $SiO_2$ layer with a thickness of about 500 nm on a back of the substrate.

In accordance with another aspect of the present invention, the magnetic film is defined by plating an Ni layer with a thickness of about 100 nm and a Co layer having a thickness of about 100 nm on the oxide.

In accordance with another aspect of the present invention, the magnetic field transduing device having a low cross sensitivity and a symmetric sensitivity.

In accordance with another aspect of the present invention, the magnetic field transducing device can be integrable formed in an integrated circuit.

BRIEF DESCRIPTION OF THE DRAWINGS

The present invention may best be understood through the following description with reference to the accompanying drawing, in which:

FIGS. 1(*b*) & 1(*c*) are sectional views taken along lines A-A' and B-B' in FIG. 1(*a*);

DETAILED DESCRIPTION OF THE PREFERRED EMBODIMENT

Figure 1A:
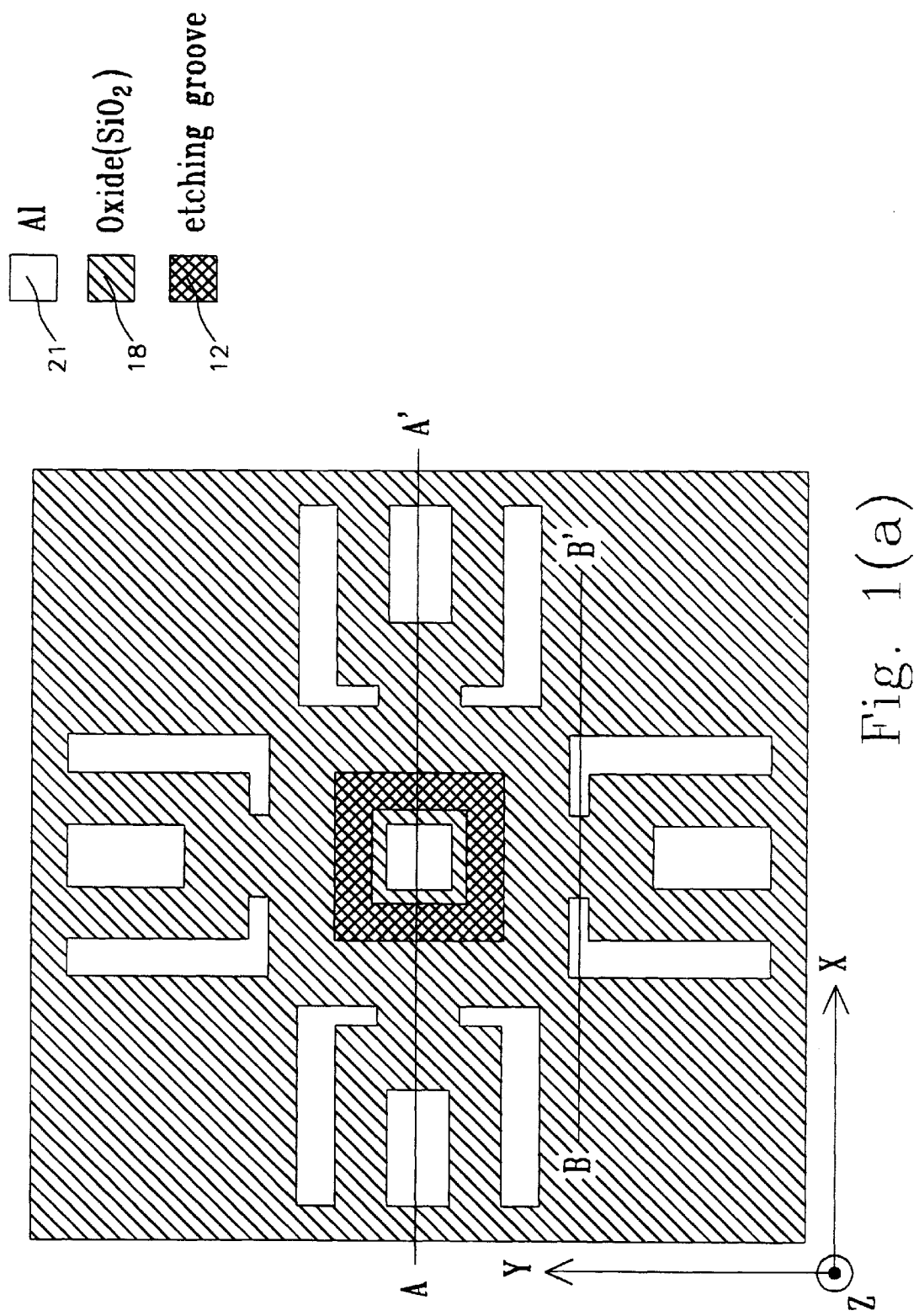
FIG. 1(*a*) is a schematic diagram showing a preferred embodiment of a configuration of a magnetic field transducer according to the present invention.
Figure 1B:
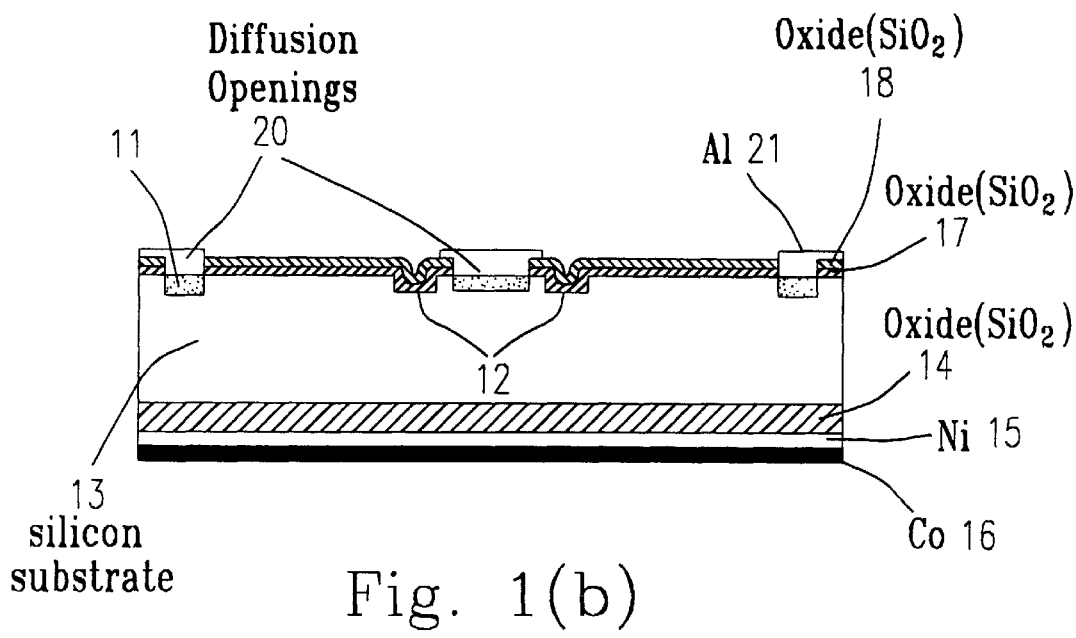
Figure 1C:
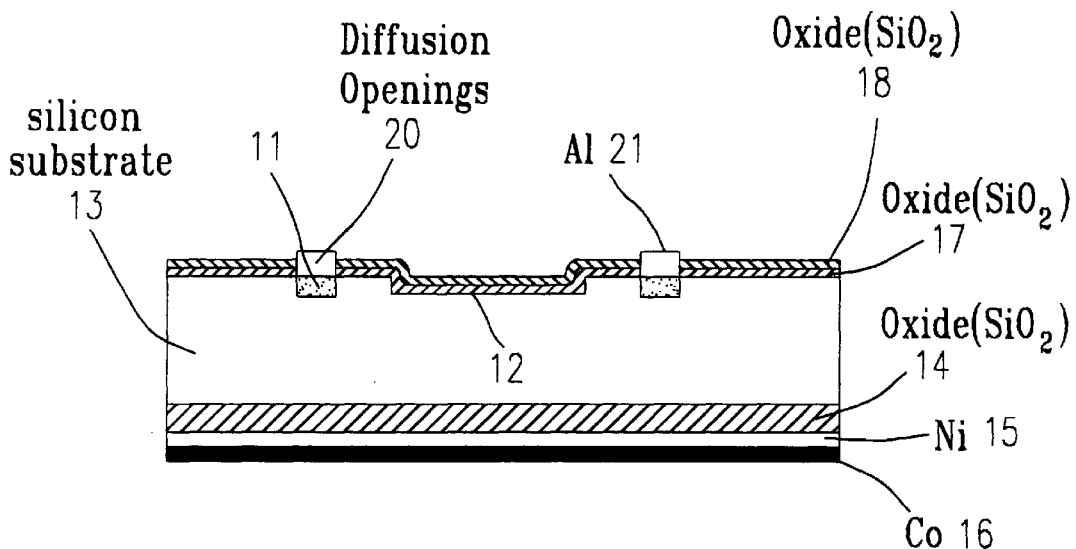

Please refer to FIGS. 1(a)~1(c) which are respectively an elevational view and two sectional views of a preferred embodiment of a configuration of a magnetic field transducer according to the present invention.

A preferred embodiment of a method for manufacturing the magnetic field transducer according to the present invention includes the following process.

Figure 2:
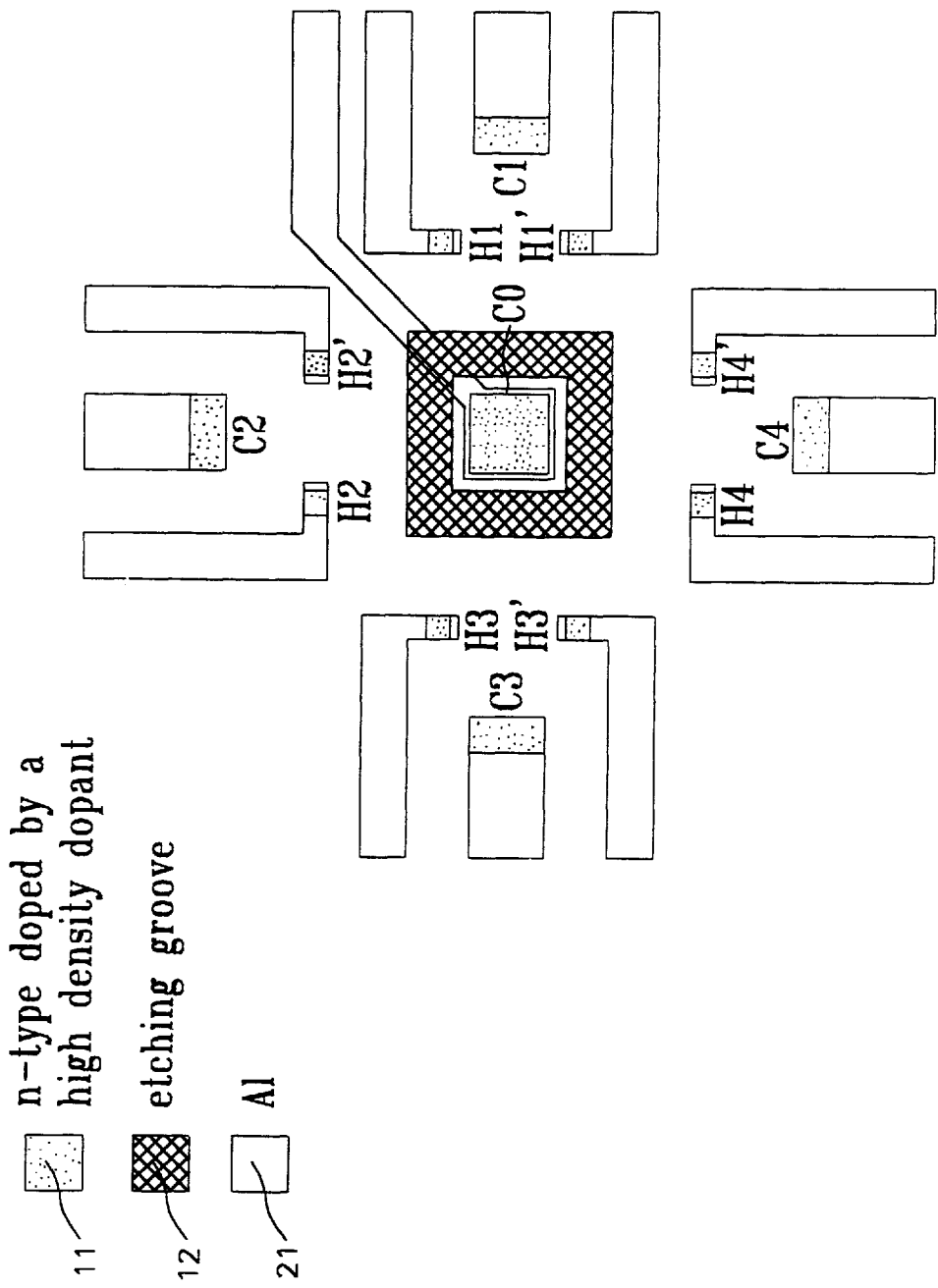
FIG. 2 is a schematic diagram showing a preferred embodiment of a metal connecting line according to the present invention.

A first photoresist (not shown) made of an AZ 6400-type photoresist is covered on an n-type silicon substrate 13, and a first mask is implemented in a photolithography etching process to form on the substrate 13 an exposed annular portion (not shown) for later being etched through to form an annular groove 12 having respectively a depth, a width and a circumferential length of 2 μm, 100 μm and 2000 μm by an etching solution composed by $HNO_3$, HF(Aq) and $CH_3COOH$ having a ratio of 26:1:33. A first $SiO_2$ layer 17 with a thickness of about 300 nm for forming a second photoresist (not shown) is deposited over the silicon substrate 13 and a second mask photolithography etching process is implemented to etch the second photoresist in order to define on the silicon substrate 13 an exposed region (not shown) for forming by the etching solution a diffusion opening 20 for later being processed via doping the substrate 13 by $POCl_3$ at about 25° C. for about 10 minutes and a drive-in process at about 900° C. for about 20 minutes in order to form an n+ region 11 including therein a high density dopant in the substrate 13. Further formed is a third photoresist (not shown) on the substrate 13 by growing a second $SiO_2$ layer 18 with a thickness of about 300 nm on the n+ region 11 and by using a third mask photolithography etching process to form exposed regions (not shown) on the substrate 13 for later defining the contacts on the n+ region 11 by the etching solution. Thereafter, Al layer 21 is plated having a thickness of about 500 nm on the contacts C0~C4, H1~H4 and H1'~H4' of the n+ region 11 over the substrate 13, and the Al layer 21 is patterned by a fourth photolithography etching process, as shown in FIG. 2.

In addition, deposit an oxide ($SiO_2$) layer 14 having a thickness of about 500 nm on the back of the silicon substrate 13, as shown in FIGS. 1(b) & 1(c), and plate a magnetic film including an Ni layer 15 and a Co layer 16 both having a thickness of about 100 nm on the oxide ($SiO_2$) layer 14 in order to obtain a magnetic field transducing device which can be integrated with a relevant circuit.

Figure 3:
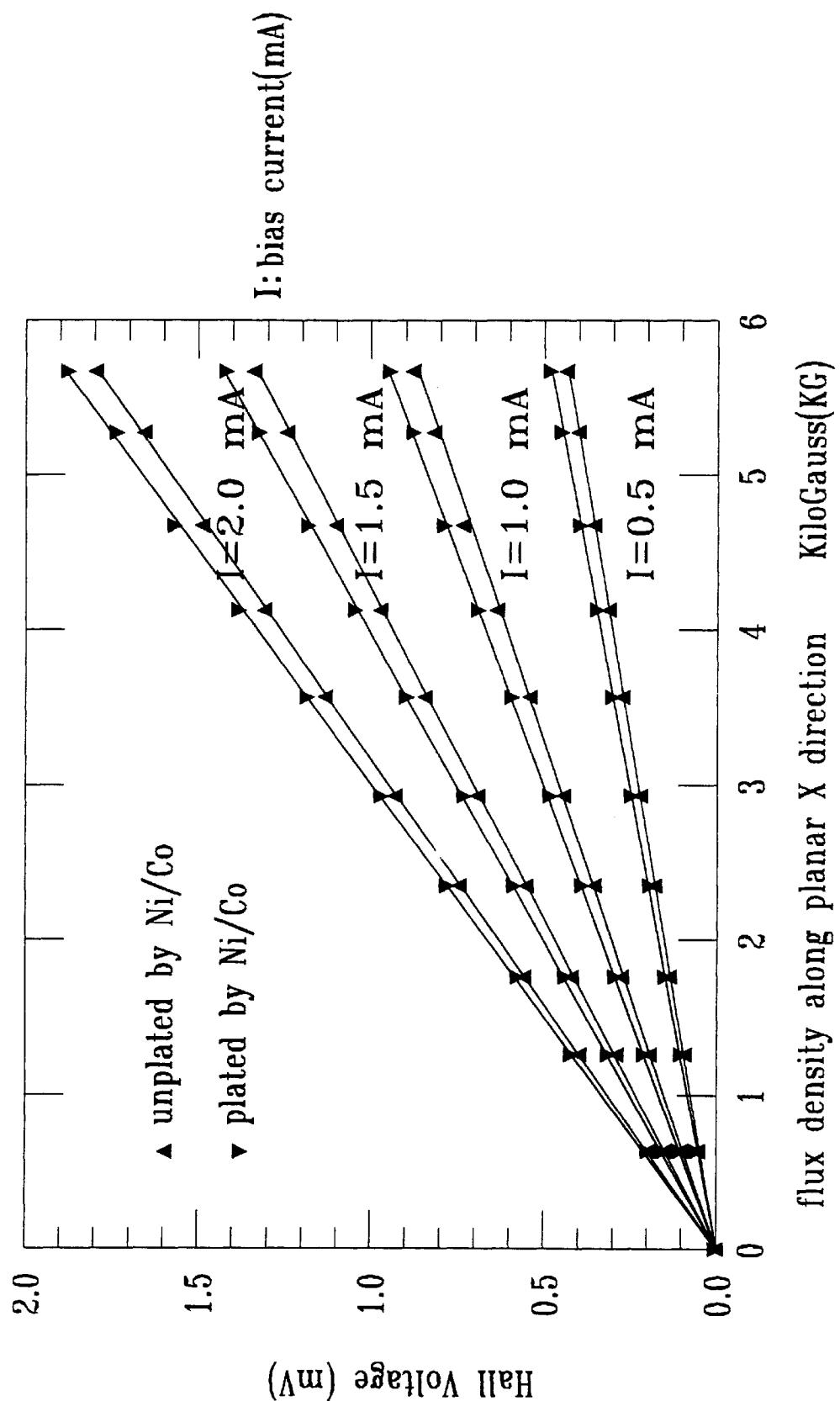
FIG. 3 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the X direction.

FIG. 3 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the X direction.

Figure 4:
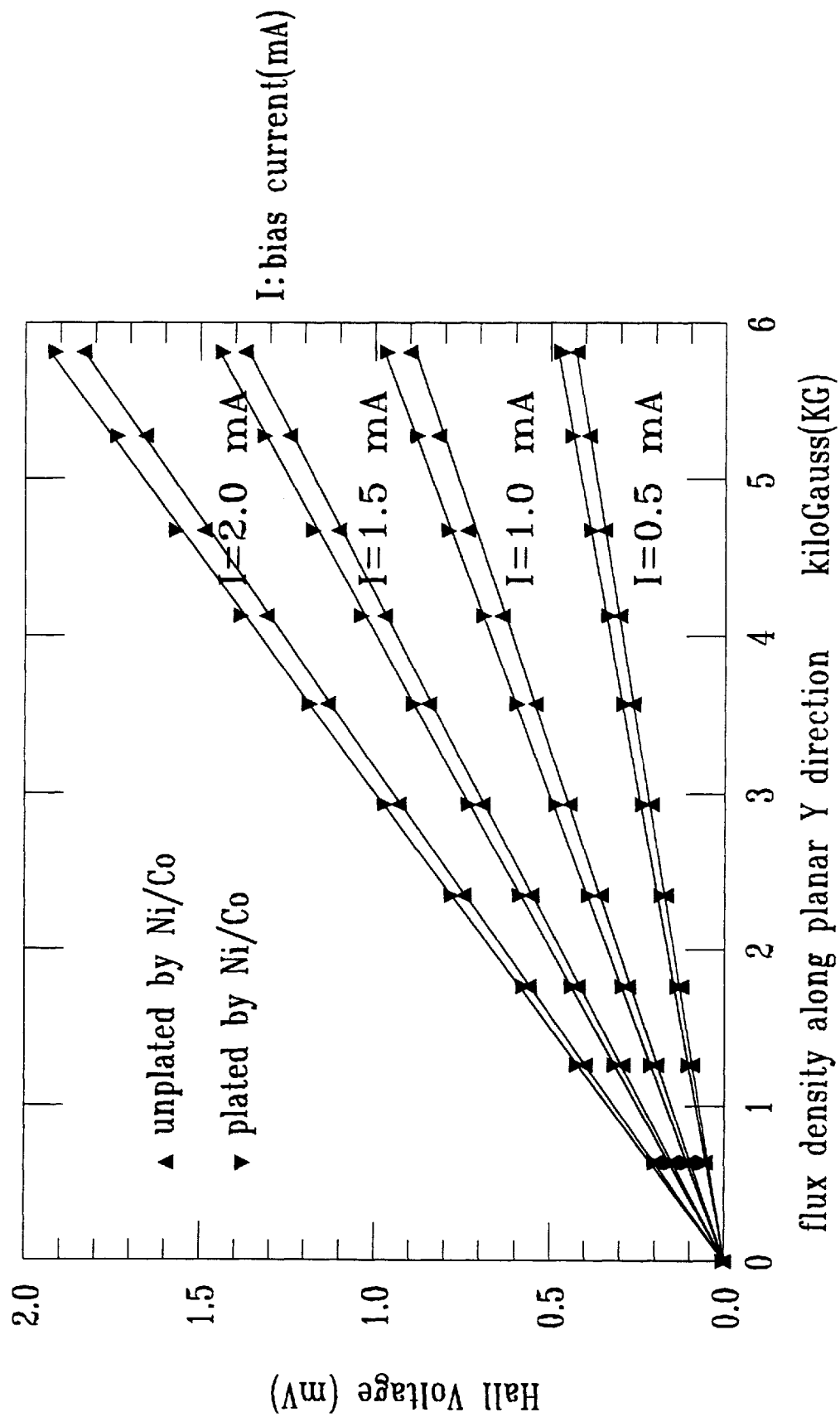
FIG. 4 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the Y direction.

FIG. 4 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the Y direction.

Figure 5:
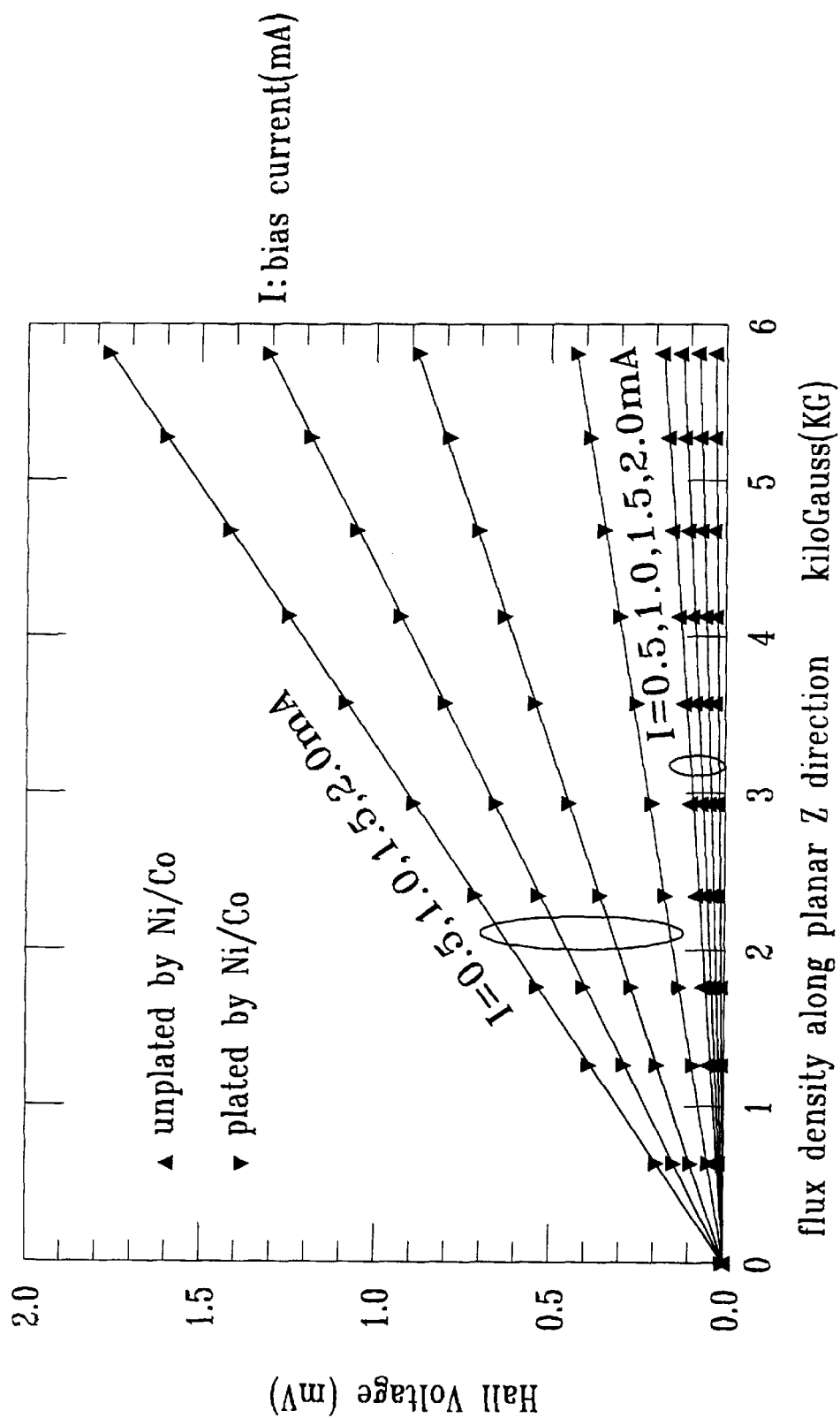
FIG. 5 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the Z direction.

FIG. 5 shows comparing results of the Hall currents respectively generated by a preferred embodiment of a magnetic field transducer according to the present invention and a conventional Hall device not being plated thereon a magnetic film, with an application of a bias current and a variety of the flux densities having different intensities along the Z direction.

Figure 6:
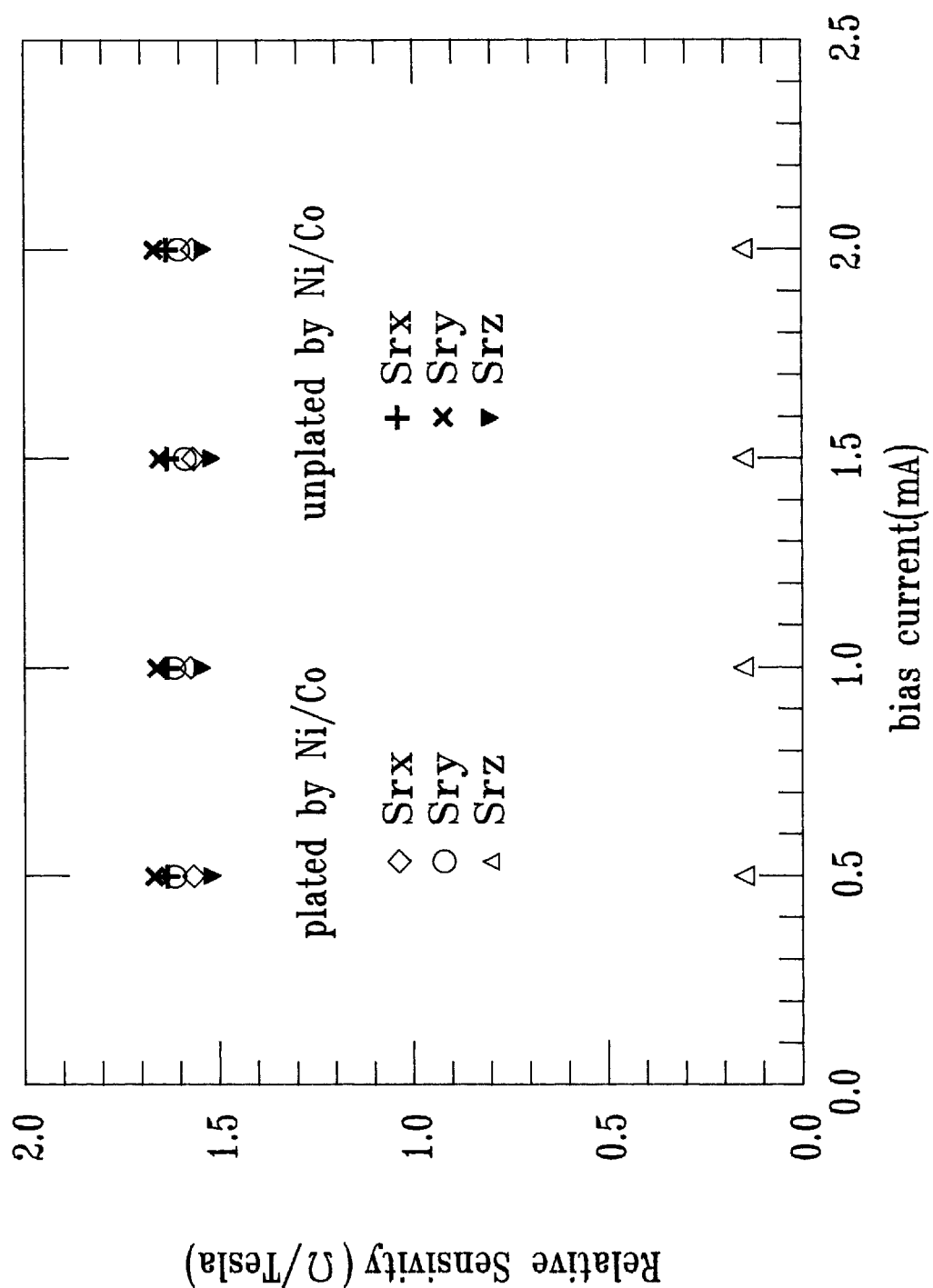
FIG. 6 depicts comparing results of the respective relative sensitivities of a preferred embodiment of a magnetic field transducer according to the present invention and a conventional Hall device not being plated thereon a magnetic film, respectively along the X, Y and Z directions, under an application of a variety of bias currents having respectively different intensities.

FIG. 6 depicts comparing results of the respective relative sensitivities of a preferred embodiment of a magnetic field transducer according to the present invention and a conventional Hall device not being plated thereon a magnetic film, respectively along the X, Y and Z directions, under an application of a variety of bias currents having respectively different intensities.

Figure 7:
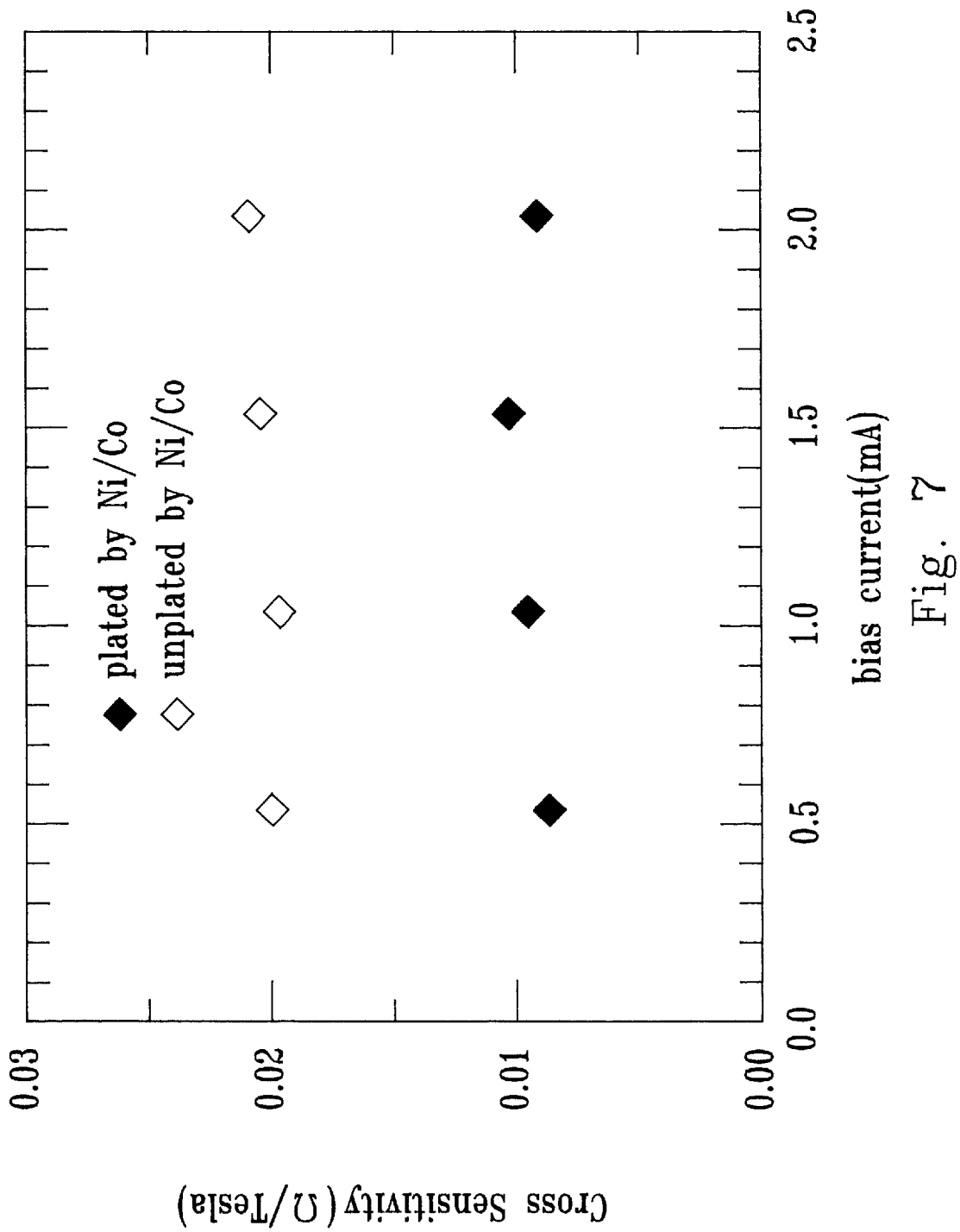
FIG. 7 depicts a comparing result of the respective cross sensitivities of a preferred embodiment of a magnetic field transducer according to the present invention and a conventional Hall device not being plated thereon a magnetic film, respectively along the X, Y and Z directions, under an application of a variety of bias currents having respectively different intensities.

FIG. 7 depicts comparing results of the respective cross sensitivities of a preferred embodiment of a magnetic field transducer according to the present invention and a conventional Hall device not being plated thereon a magnetic film, respectively along the X, Y and Z directions, under an application of a variety of bias currents having respectively different intensities.

According to FIGS. 3~5, comparing results of the Hall currents respectively generated by a preferred embodiment of a magnetic field transducer according to the present invention and a conventional Hall device not being plated thereon a magnetic film, with an application of a bias current and a variety of the flux densities having different intensities along the X, Y and Z directions, it is evident that the sensitivity of the magnetic field transducer plated by a magnetic film as disclosed in the present invention is distinguishably improved from that of the conventional Hall device with applications of the flux densities respectively along the X and Y directions. Moreover, the sensitivity of the present invention is almost promoted by an order of magnitude under the application of a Z direction flux density than that of the conventional Hall device.

Additionally, an improved relative sensitivity is achieved by the present invention, as portrayed in FIG. 6. Also, the cross sensitivity is explicitly depressed in the magnetic field transducer according to the present invention contrary to that of the conventional Hall device, as depicted in FIG. 7.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a magnetic field transducing device as part of an integrated circuit, comprising:
   (a) providing a substrate;
   (b) subjecting said substrate to a semiconductor device fabricating process in order to obtain a magnetic field transducer on a first side of said substrate, wherein said semiconductor device fabricating process comprising:
      (b1) utilizing a first mask photolithography etching process to form an annular groove on said substrate;
      (b2) covering a first oxide layer on said substrate and using a second mask photolithography etching process to form a plurality of diffusing openings on said first oxide layer;
      (b3) forming extrinsic semiconductor regions on said substrate exposed by said plurality of diffusion openings;
      (b4) forming a second oxide layer on said substrate;
      (b5) utilizing a third mask photolithography etching process to form a plurality of contacts on said extrinsic semiconductor regions; and
      (b6) forming a conductor on said substrate in order to form a connecting line;
   (c) forming an oxide over a second side of said substrate; and
   (d) forming a magnetic film on said oxide in order to obtain said magnetic field transducing device.

2. A method for manufacturing a magnetic field transducing device as claimed in claim 1, wherein said second side of said substrate is the back of said substrate.

3. A method for manufacturing a magnetic field transducing device as claimed in claim 1, wherein said oxide over a second side is formed by depositing a $SiO_2$ layer with a thickness of about 500 nm on a back of said substrate.

4. A method for manufacturing a magnetic field transducing device as claimed in claim 1, wherein said magnetic film is defined by plating an Ni layer with a thickness of about 100 nm and a Co layer having a thickness of about 100 nm on said oxide over a second side.

5. A method for manufacturing a magnetic field transducing device as claimed in claim 1, wherein said step (b3) further includes following steps:
   (b31) heating said substrate by a heater at about 900° C., and exposing said substrate to $POCl_3$ at about 25° C. for about 10 minutes; and
   (b32) performing a drive-in process at about 900° C. for about 20 minutes in order to diffuse an n+ region in said substrate.

6. A method for manufacturing a magnetic field transducing device as claimed in claim 1, wherein said substrate is an n-type silicon substrate.

7. A method for manufacturing a magnetic field transducing device as claimed in claim 1, wherein said connecting line is formed by plating aluminum (Al) to a thickness of about 500 nm over said substrate and processing said aluminum by a fourth mask photolithography etching process.

8. A method for manufacturing a magnetic field transducing device as claimed in claim 7, wherein said fourth mask photolithography etching process includes a step of patterning said plated aluminum into said connecting line.

9. A method for manufacturing a magnetic field transuding device as claimed in claim 1, wherein said third mask photolithography etching process further includes following steps:
   (b41) forming a second plurality of exposed regions on said substrate; and
   (b42) etching said second plurality of exposed regions by a third etching solution to form said plurality of contacts.

10. A method for manufacturing a magnetic field transducing device as claimed in claim 9, wherein said third etching solution includes $HNO_3$, HF(Aq) and $CH_3COOH$ with a ratio of 26:1:33.

11. A method for manufacturing a magnetic field transducing device as claimed in claim 1, wherein said second mask photolithography etching process further includes following steps:
   (b21) forming a first plurality of exposed regions on said substrate; and
   (b22) etching said first plurality of exposed regions by a second etching solution to form said plurality of diffusing openings.

12. A method for manufacturing a magnetic field transducing device as claimed in claim 11, wherein said second etching solution includes $HNO_3$, HF(Aq) and $CH_3COOH$ with a ratio of 26:1:33.

13. A method for manufacturing a magnetic field transducing device as claimed in claim 1, wherein said second mask photolithography etching process further comprises:
   (b11) forming an exposed annular portion on said substrate; and
   (b12) etching said exposed substrate by a first etching solution in order to define said annular groove.

14. A method for manufacturing a magnetic field transducing device as claimed in claim 13, wherein said first etching solution includes $HNO_3$, HF(Aq) and $CH_3COOH$ with a ratio of 26:1:33.

15. A method for manufacturing a magnetic field transducing device as claimed in claim 13, wherein a depth, a width and a circumference of said annular groove are respectively about 2 $\mu$m, 100 $\mu$m and 400 $\mu$m.

* * * * *